United States Patent [19]

Hickman et al.

[11] Patent Number: 5,155,390
[45] Date of Patent: Oct. 13, 1992

[54] PROGRAMMABLE BLOCK ARCHITECTED HETEROGENEOUS INTEGRATED CIRCUIT

[75] Inventors: Patrick T. Hickman, Chandler; Douglas W. Schucker, Mesa; Jarvis Tou, Gilbert, all of Ariz.

[73] Assignee: Motorola, Inc., Schaumburg, Ill.

[21] Appl. No.: 735,744

[22] Filed: Jul. 25, 1991

[51] Int. Cl.$^5$ .................. H01L 27/10; H01L 25/00; H03K 3/38

[52] U.S. Cl. .................. 307/465.1; 307/307; 307/482.1; 357/45; 357/71

[58] Field of Search .............. 357/45, 71; 307/307.1, 307/465.1, 482.1

[56] References Cited

U.S. PATENT DOCUMENTS

| | | | |
|---|---|---|---|
| 4,661,815 | 4/1987 | Takayama et al. | 357/45 |
| 4,748,488 | 5/1988 | Suzuki et al. | 357/45 |
| 4,811,073 | 3/1989 | Kitamura et al. | 357/45 |
| 4,910,574 | 3/1990 | Aipperspach et al. | 357/45 |
| 4,969,029 | 11/1990 | Ando et al. | 357/45 |
| 5,008,728 | 4/1991 | Yamamura et al. | 357/40 |

Primary Examiner—Eugene R. LaRoche
Assistant Examiner—Michael B. Shingleton
Attorney, Agent, or Firm—Bradley J. Botsch

[57] ABSTRACT

A block architected integrated circuit having predetermined power and signal grid structures is provided. The integrated circuit includes a plurality of function blocks such as firm function blocks, standard cell logic blocks, and gate array logic blocks which are all designed according to the power and signal grid structures of the integrated circuit and from standard library elements of the base cell array. These function blocks have full floating capability with respect to the granularity of the power and signal grid structures.

The integrated circuit also includes one or more hard function blocks which are not designed according to the power or signal grid structures of the integrated circuit. Further, the integrated circuit may also include one or more blocks which are designed from a different technology than the base cell array of the integrated circuit and, thus are also not designed according to the power or signal grid structures of the integrated circuit. As a result, these blocks must be adapted to readily fit within the power and signal grid structures of the integrated circuit. However, once adapted, these blocks also have full floating capability with respect to the granularity of the power and signal grid structures.

13 Claims, 3 Drawing Sheets

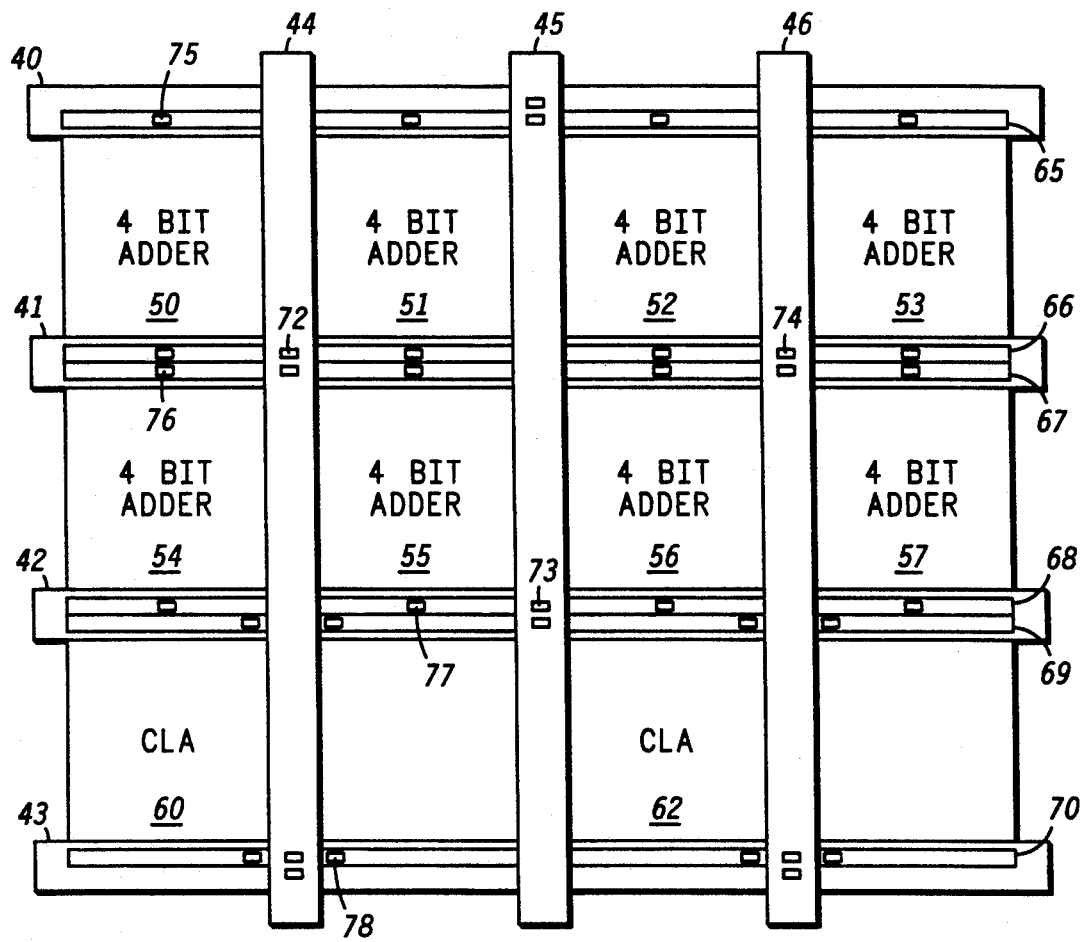
FIG. 2
FIG. 3
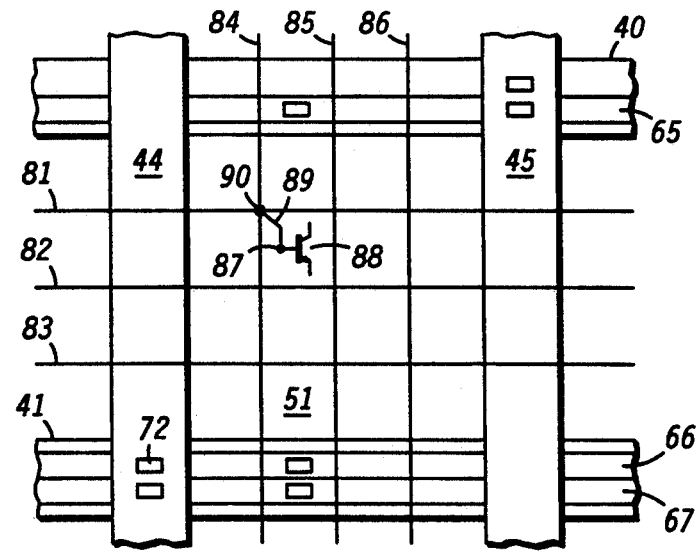

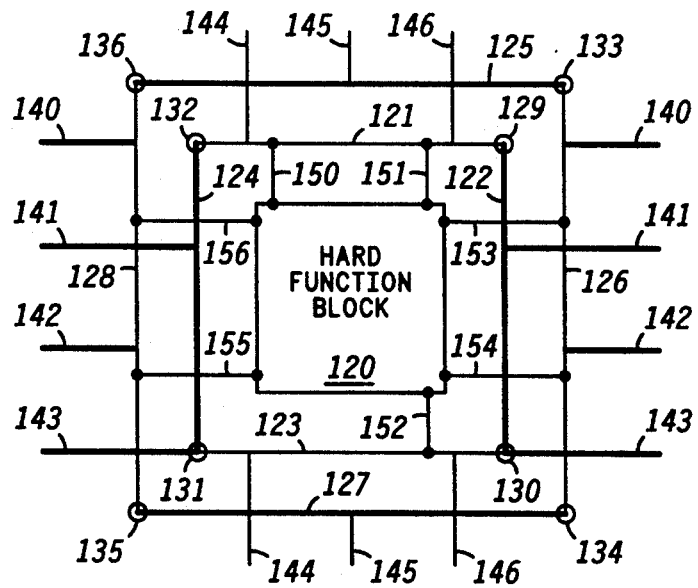
FIG. 4
FIG. 5
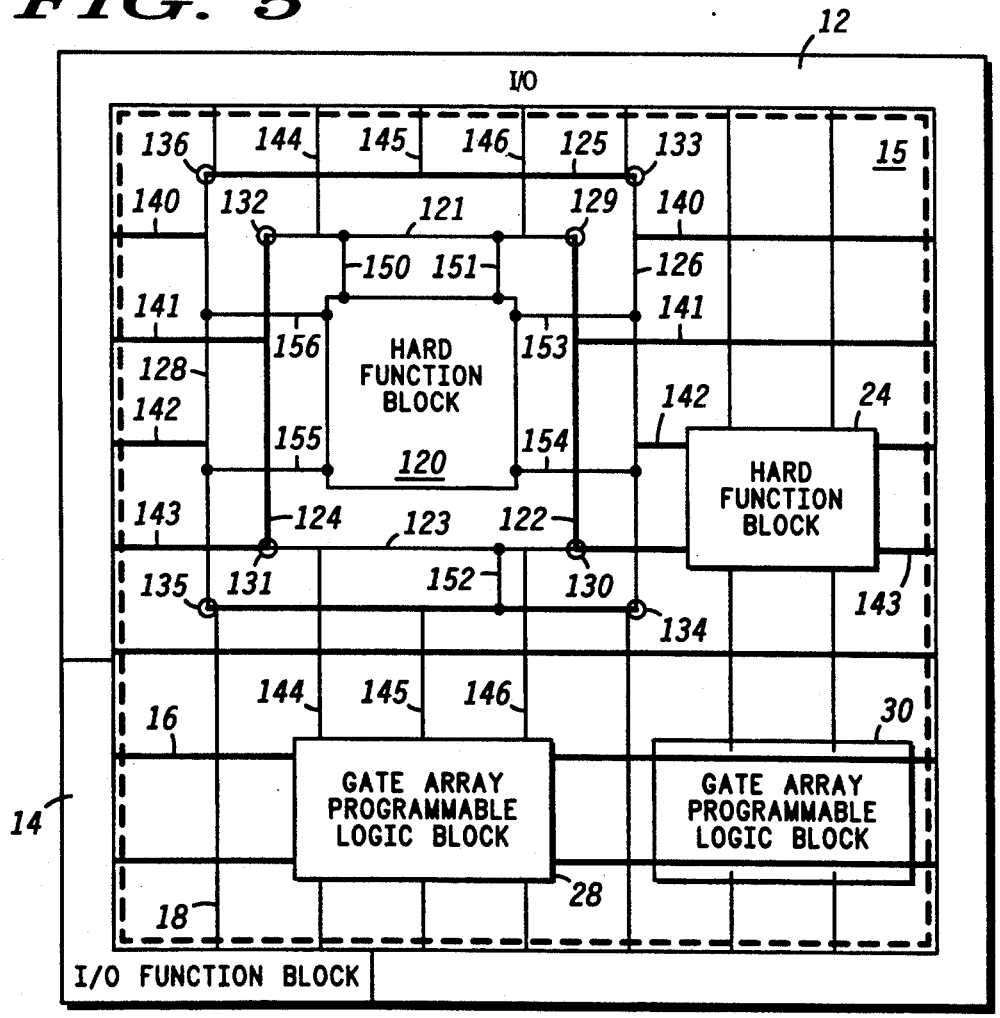

PROGRAMMABLE BLOCK ARCHITECTED HETEROGENEOUS INTEGRATED CIRCUIT

BACKGROUND OF THE INVENTION

This invention relates to integrated circuits, for example, a programmable block architected heterogeneous integrated circuit.

Current application specific integrated circuit (ASIC) designs are built from a family of primitive logic elements such as NAND gates, NOR gates, multiplexers and adders. This may have been an acceptable design process when the gate count was low, for example, 50K or less. However, as the density of ASIC's increases, the method of building an ASIC from a family of primitive elements becomes very inefficient, error prone and time consuming.

One improvement over building ASIC's from a family of primitive logic elements is to pre-diffuse an ASIC with selected function blocks wherein the function blocks are designed from the family of primitive elements. However, since the function blocks are pre-diffused, they are confined to fixed locations within the ASIC. As a result, it may be difficult to modify the pre-diffused ASIC to accommodate a later ASIC design thereby prohibiting one from re-using the work generated from the earlier pre-diffused ASIC.

As an example, consider an ASIC that includes a first function block pre-diffused in a selected corner of the ASIC. Further, the input ports of the first function block are located near the periphery of the ASIC for coupling to I/O buffers. Further, the output ports of the first function block are coupled to input ports of a second function block.

Now assume that in a later ASIC design, one would like to modify the existing ASIC by inserting a third function block between the I/O buffers and the first function block. However, due to the proximity of the pre-diffused first function block, the interconnection between the first and the third function blocks may be difficult if not impossible to establish. Thus, all work previously performed on the earlier ASIC becomes futile when developing the later modified ASIC.

Hence, a need exists for a block architected integrated circuit that allows for re-use of earlier developed function blocks.

SUMMARY OF THE INVENTION

Briefly, there is provided a programmable block architected integrated circuit comprising a power grid structure having a first plurality of power conductors separated by a first predetermined distance and a second plurality of power conductors separated by second predetermined distance, each one of the first plurality of power conductors being perpendicular to each one of the second plurality of power conductors; and at least one logic function block being designed with respect to the power grid structure such that the logic function block has full floating capability within the programmable block architected integrated circuit.

The present invention will be better understood from the following detailed description taken in conjunction with the accompanying drawings.

BRIEF DESCRIPTION OF THE DRAWINGS

FIG. 2 is a block diagram illustrating an example of a firm function block;

FIG. 3, is a block diagram illustrating a more detailed view of a portion of the firm function block shown in FIG. 2;

FIG. 4 is a block diagram illustrating encapsulation of a hard function block; and FIG. 5 is a block diagram illustrating the placement of the encapsulated hard function block of FIG. 3 in the programmable block architected heterogeneous integrated circuit.

DETAILED DESCRIPTION OF THE DRAWINGS

Figure 1:
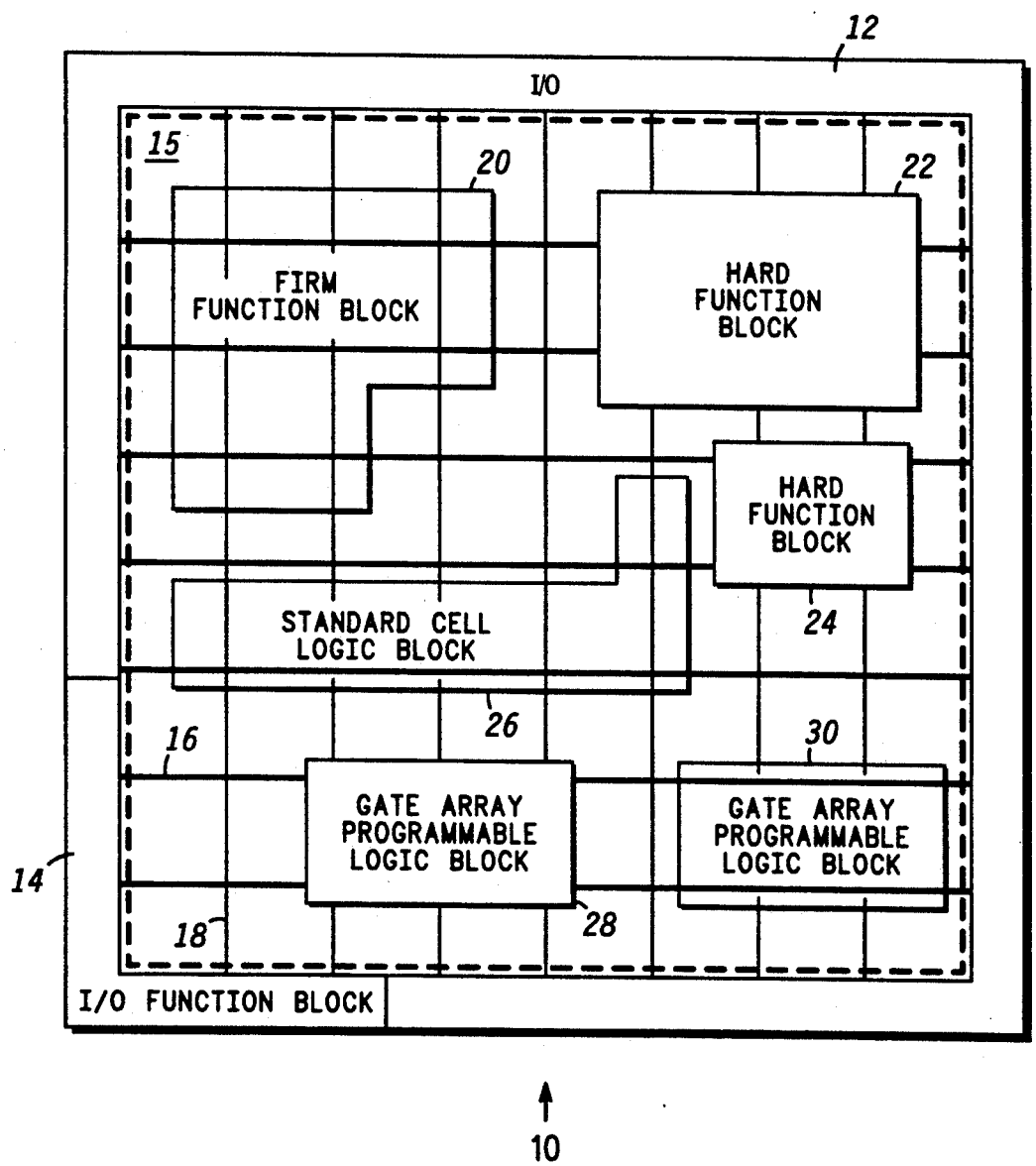
FIG. 1 is a block diagram illustrating a programmable block architected heterogeneous integrated circuit in accordance with the present invention.

Referring to FIG. 1, a block diagram illustrating programmable block architected integrated circuit 10 is shown comprising a peripheral outer area which includes I/O circuitry 12 and I/O function block circuitry 14.

Inner core area 15 of integrated circuit 10 is designed and laid out according to a predetermined power grid structure as exemplified by the plurality of horizontal power conductors, such as power conductor 16, and the plurality of vertical power conductors, such as power conductor 18. As an example, the horizontal power conductors may consecutively alternate from being a first voltage or a second voltage such that if power conductor 16 were at a first voltage, the two horizontal power conductors would be at a second voltage. Likewise, the vertical power conductors may also consecutively alternate from being first voltage or a second voltage.

Inner core area 15 of integrated circuit 10 further includes firm function block 20, hard function blocks 22 and 24, standard cell logic block 26, and gate array programmable logic blocks 28 and 30.

Firm function block 20, standard cell logic block 26 and a gate array programmable logic block 30 are all designed corresponding to the predetermined power grid structure of integrated circuit 10. As a result, the plurality of horizontal and vertical power conductors are shown to continuously pass through these function blocks.

However, hard function blocks 22 and 24 as well as gate array programmable logic block 28 are typically not designed corresponding to the power grid structure of integrated circuit 10 and, thus, possess a different type of power grid structure than integrated circuit 10. Further, blocks 22, 24 and 28 may have been generated in a variety of fashions wherein most of the effort may have been focused on custom implementations.

In order to utilize these function blocks and thereby benefit from the work of previous design efforts, these blocks must be encapsulated in a manner that they easily adapt to the power grid structure of integrated circuit 10. In other words, an adapting means must be utilized so as to allow a block which has a power grid structure different than the power grid structure of integrated circuit 10 to be easily placed anywhere within integrated circuit 10. This adapting means for hard function blocks will be described in detail hereinafter.

Referring back to firm function block 20, it is understood that a firm function block can be manually or automatically created by using standard library primitive elements. Further, these primitive elements can range from fully diffused structures to simple metal programmable structures.

However, it must be noted that the main requirement of a firm function block is that it adheres to specific technology design rules with respect to the power grid structure of the base cell array (integrated circuit 10) so that integration of a firm function block into a top level design is easily achieved. In addition, it should be noted that a firm function block does not need to be rectangular as clearly exemplified by firm function block 20. Also, a firm function block is designed to maintain all of its individual primitive elements together in one area of the integrated circuit, rather than spread out within the integrated circuit. As a result, the interconnect for a firm function block is minimized.

Referring to FIG. 2, a block diagram illustrating a 32 bit adder implemented as a firm functional block is shown. The 32 bit adder is designed according to the power grid structure of integrated circuit 10 whereby power conductors 40-43 represent horizontal power conductors similar to power conductor 16 of FIG. 1, while power conductors 44-46 represent vertical power supply conductors similar to power conductor 18 of FIG. 1.

4 BIT ADDERs 50-57 as well as carry look-ahead adders (CLA) 60 and 62 are clearly shown to be designed around the power grid structure of integrated circuit 10 wherein CLA's 60 and 62 are shown to consume approximately twice the area of any one of 4 bit adders 50-57. Further, local power conductors 65-70 are shown to be coupled to the horizontal and vertical power conductors of integrated circuit 10 for distributing power locally to 4 BIT ADDERs 50-57 and the CLA's 60 and 62.

In particular, contact vias 72-74 are respectively utilized to supply the voltage appearing on power conductors 44-46 to the 32 bit adder. Likewise, contact vias 75-78 are respectively utilized to supply the voltage appearing on power conductors 40-43 to the 32 bit adder. Further, it is understood that 4 BIT ADDERs 50-57 and CLA's 60 and 62 are designed from standard library primitive elements.

Once a firm function block is created, the placement and routing information of the firm function block is stored. This information can be subsequently retrieved when performing a top level block design. Further, since a firm function block is designed from a library of primitive elements which are further designed from basic cells of integrated circuit 10, a firm function block may be simulated at the behavioral level for functionality, or the primitive gate level for critical timing analysis.

It is important to realize that since firm function block 20 is referenced to the power grid structure of integrated circuit 10, firm function block 20 has full floating capability with respect to the granularity of the power grid structure of integrated circuit 10. In other words, firm function block 20 is designed in a particular manner with respect to the power grid structure of integrated circuit 10, and can be moved around anywhere within inner core area 15 of integrated circuit 10 provided that it maintains its proper reference to the power grid structure.

For example to better illustrate the full floating capability, power conductors 44-46 could be any three consecutive conductors of the plurality of vertical power conductors as shown in FIG. 1. Similarly, power conductors 40-43 could be any four consecutive conductors of the plurality of horizontal power conductors as shown in FIG. 1. However, the 32 bit adder could not be placed on integrated circuit 10 such that the center of 4 BIT ADDER 50, denoted by reference number 79, directly lies under power conductor 40, 41 or 44. Thus, it is said that the 32 bit adder must maintain its position with respect to the granularity of the power grid structure of integrated circuit 10.

In addition to designing a firm function block with respect to the power grid structure of integrated circuit 10, the input and output ports of the firm function block must also be adapted to a signal grid structure of the base cell array of integrated circuit 10.

Referring to FIG. 3, a more detailed view of 4 BIT ADDER 51 of FIG. 2 is shown. It is understood that the components shown in FIG. 3 which are identical to components shown in FIG. 2 are identified by like reference numbers. In addition, horizontal signal lines 81-83 and vertical signal lines 84-86 are shown which comprise a portion of the signal grid structure of integrated circuit 10. It is understood that a plurality of horizontal signal lines similar to signal lines 81-83, and a plurality of vertical signal lines similar to signal lines 84-86 exist within integrated circuit 10 and form a signal grid structure similar to the aforedescribed power grid structure. Further, signal lines 81-86 may exist on the same metal layer as the power conductors of the power grid structure or signal lines 81-86 may exist on a different metal layer.

As an example of adapting an input port of 4 BIT ADDER 51 to the signal grid structure formed by signal lines 81-86, suppose it is desired to couple metal pad 87, which is coupled to the base of transistor 88, to the signal grid. One way to accomplish this is to utilize metal conductor 89 to couple metal pad 87 to metal pad 90 wherein metal pad 90 lies on the the intersection of signal lines 81 and 84. In this manner, metal pad 87 has been adapted to the signal grid structure. It should be realized that in a similar aforedescribed manner, other metal pads, which represent various input and output ports of 4 BIT ADDER 51, may be coupled to other metal pads which lie on intersection points of signal lines 81-86.

In summary, a firm function block, such as the 32 bit adder shown in FIG. 2, utilizes primitive logic elements in a hierarchical manner such that the resulting placement and interconnect of the primitive logic elements are subsequently "firmed" up to be used as another higher hierarchical element. Further, the firm function block is designed with respect to the power and signal grid structures of integrated circuit 10 to allow for full floating capability within integrated circuit 10.

As aforementioned, high level structured design requires the use of large functional blocks. Some of these blocks may have been generated in a variety of fashions with most of the effort focused on custom implementations. This tends to be very time consuming while the function re-use of many large blocks is often difficult. However, the present invention describes a method to adapt a large functional block, which was not designed according to the power grid structure of integrated circuit 10, to be re-used in a top level design within integrated circuit 10.

The development of hard function blocks 22 and 24 may include an automatic generation of a custom diffused macro function such as a RAM or even a microprocessor unit (MPU). Since the hard function block typically has its own internal power distribution structure, it must be encapsulated by a power termination structure (power adapter) to allow for automatic termination within the power grid structure of integrated circuit 10. In other words, hard function blocks 22 and 24 must be adapted to adequately fit within the power grid structure of integrated circuit 10, while still maintaining current permeability through all of the power conductors.

An example illustrating the method of power encapsulation of a hard function block is shown in FIG. 4. Hard function block 120 is shown to be encapsulated by metal conductors 121-128 wherein metal conductors 121-124 form an inner ring, while metal conductors 125-128 form an outer ring and wherein both inner and outer rings encompass hard function block 120.

Metal conductors 121, 123, 126 and 128 are shown as thin lines to represent that they are formed on a first selected metal layer, while metal conductors 122, 124, 125 and 127 are shown as thick lines to represent that they are formed on a second selected metal layer. Further, via contacts 129-136 are utilized to coupled adjacent metal conductors so that current permeability exists through both the inner and outer rings. For example, via contact 129 couples metal conductor 121 which resides on the first metal layer to metal conductor 122 which resides on the second metal layer.

The encapsulation illustrated in FIG. 4 is provided by annular structures around hard function block 120. However, it is understood that the encapsulation may have also been provided by a multi-level adapter that is positioned on top of hard function block 120.

Horizontal power conductors 140-143 which are similar to power conductor 16 of FIG. 1 are shown wherein power conductor 140 is electrically coupled to metal conductors 126 and 128. Likewise, power conductor 142 is also electrically coupled to metal conductors 126 and 128. Further, power conductor 141 is electrically coupled to metal conductors 122 and 124. Likewise, power conductor 143 is also electrically coupled to metal conductors 122 and 124.

Further, vertical power conductors 144-146 which are similar to power conductor 18 of FIG. 1 are shown wherein power conductor 144 is electrically coupled to metal conductors 121 and 123. Likewise, power conductor 146 is also electrically coupled to metal conductors 121 and 123. Further, power conductor 145 is electrically coupled to metal conductors 125 and 127.

It is worth noting that power conductors 140-146 are discontinued (terminated) as they reach the either the inner or outer ring formed by metal conductors 121-124 and 125-128, respectively. Thus, unlike a firm function block, power conductors 140-146 do not pass through hard function block 120. This is so because the power structure of a hard function block is typically different from that of integrated circuit 10.

Finally, electrical conductors 150-152 are utilized for coupling desired internal circuit nodes (not shown) of hard function block 120 to the voltage appearing on the inner ring formed by metal conductors 121-124. Likewise, electrical conductors 153-156 are utilized for coupling desired internal circuit nodes (not shown) of hard function block 120 to the voltage appearing on the outer ring formed by metal conductors 125-128.

In operation, a first voltage potential appears on power conductors 140, 142 and 145, while a second voltage potential appears on power conductors 141, 143, 144 and 146. As a result, the outer ring formed by metal conductors 125-128 is maintained at the first voltage potential, while the inner ring formed by metal conductors 121-124 is maintained at the second voltage potential.

The power termination structure also allows for current permeability through power conductors 140-146. That is, when power conductors 140-146 are terminated to allow insertion of hard function block 120, the current flowing through each one of power conductors 140-146 is not interrupted.

For example, current flowing through power conductor 140 is electrically coupled to and flows through metal conductor 128. The current then flows from metal conductor 128 to metal conductor 125 by within the power grid structure of integrated circuit 10. It is understood that the components shown in FIG. 5 which are identical to components shown in FIGS. 1 and 4 are identified by like reference numbers. Further, it is known that hard function block 120 is not restricted to the position shown in FIG. 5, but could be placed anywhere within integrated circuit 10.

It is worth noting that the power termination structure formed by the inner and outer rings allows a hard function block to be treated like any primitive macro for automatic place and route for optimal placement within integrated circuit 10. However, it is important to understand that the primitive logic elements of a hard function block are typically not available as standard library primitive elements. Thus, software simulation tools consider a hard function block as a single entity.

Similar to the aforedescribed manner shown in FIG. 3 for a firm function block, the input and output ports of hard function block 120 must also be adapted to the signal grid structure of integrated circuit 10. However, it should be realized that the input and output ports of hard function block 120 may be located internally or externally with respect to hard function block 120.

Another method to adapt the input and output ports of hard function block 120 to integrated circuit 10 is to provide a routing abstraction of hard function block 120 wherein the routing abstraction represents a simplified version of the geometric structure of hard function block 120. The routing abstraction may include information such as the location of the ports, the physical size of hard function block 120, and specific areas within hard function block 120 that the router cannot access.

For example, hard function block 120 may be represented to the router by two metal rectangles having a predetermined size. The location (X and Y coordinates) of the input and output ports of hard function block 120 are identified to the router. In addition, the router is prohibited from intersecting (on the same metal layer) either metal rectangle. Further, it is understood that the router may utilize the first or second metal layers or other additional metal layers.

In another example, metal conductors 123 and 127, shown in FIG. 4, are formed on the same metal layer, for example, the first metal layer. Further, the input and output ports of hard function block 120 are all located near metal conductor 123 and, thus, can be coupled to integrated circuit 10 via the second metal layer. This may be convenient when most of the input and output ports of a hard function block are positioned near one edge of the block.

In summary, regardless of the internal power structure of hard function block 120, hard function block 120 may be encapsulated by a power termination structure such that it can readily adapt to the internal power structure of integrated circuit 10. Thus, once encapsulated, a hard block function can be used as a higher hierarchical element similar to a firm function block wherein the hard function block has full floating capability with respect to the granularity of the power grid structure of integrated circuit 10 as aforedescribed.

Referring back to FIG. 1, standard cell logic block 26 includes a plurality of basic standard cells which are designed according to the power grid structure of integrated circuit 10. The basic standard cells can be coupled in any desired fashion to perform a desired function, as is known.

Similarly, gate array programmable logic block 30 includes a plurality of gate array circuits which are designed with respect to the power grid structure of integrated circuit 10. Likewise, the gate array circuits can be coupled in any desired fashion to perform a desired function, as is known.

On the other hand, gate array programmable logic block 28 includes a plurality of gate array circuits which are of a different technology type than the base cell array of integrated circuit 10. Therefore, the internal power grid structure of gate array programmable logic block 28 is typically not designed accordingly to the power grid structure of integrated circuit 10. However, gate array programmable logic block 28 can be encapsulated in a similar aforedescribed manner as a hard function block so as to allow gate array programmable logic block 28 to adequately adapt to the power grid structure of integrated circuit 10.

It is worth noting that gate array programmable logic block 28 may be viewed as a separate integrated circuit wherein it may include firm function blocks and hard function blocks similar to blocks 20 and 22 of FIG. 1 but only in the respective technology of gate array programmable logic block 28.

As an example, suppose that the base cell array of integrated circuit 10 is CMOS. Therefore, firm function block 20, standard cell logic block 26 and gate array programmable logic block 30 are all designed from standard library primitive elements and with respect to the power grid structure of integrated circuit 10.

Further, hard function blocks 22 and 24 are CMOS macros which have not been designed with respect to the power grid structure of integrated circuit 10. Thus, they are encapsulated by a power termination structure as aforedescribed.

In addition, gate array programmable logic block 28 is ECL and has an internal power grid structure different than that of integrated circuit 10. Thus, gate array programmable logic block 28 is encapsulated by a power termination structure as aforedescribed to readily fit within integrated circuit 10. Also, gate array programmable logic block 28 may include firm function blocks which are designed according to its power grid structure. Gate array programmable logic block 28 may also include hard function blocks of ECL macros which are not designed according to the power grid structure of gate array programmable logic block 28. Thus, these ECL hard function blocks must be encapsulated by a power termination structure to adequately fit within the power grid structure of gate array programmable logic block 28. It is by this manner that "nested" functions are designed.

By now it should be apparent from the foregoing discussion that a novel programmable block architected heterogeneous integrated circuit has been provided which allows for full floating capability of the function blocks with respect to the power grid structure of the integrated circuit.

While the invention has been described in conjunction with specific embodiments thereof, it is evident that many alterations, modifications and variations will be apparent to those skilled in the art in the light of the foregoing description. Accordingly, it is intended to embrace all such alterations, modifications and variations in the appended claims.

We claim:

1. A programmable block architected integrated circuit, comprising:
a fixed power grid structure having a first plurality of power conductors each one of said first plurality of power conductors being separated by a first predetermined distance with respect to adjacent ones of said first plurality of power conductors, and a second plurality of power conductors each one of said second plurality of power conductors being separated by second predetermined distance with respect to adjacent ones of said second plurality of power conductors, each one of said first pluality of power conductors being perpendicular to each one of said second plurality of power conductors; and
at least one logic function block being designed with respect to said fixed power grid structure such that said at least one logic function block has full floating capability with respect to said fixed power grid structure.

2. The programmable block architected integrated circuit according to claim 1 wherein said at least one logic function block is created manually or automatically, and wherein said at least one logic function block is placed manually or automatically within the programmable block architected integrated circuit.

3. The programmable block architected integrated circuit according to claim 1 wherein a first portion of said first plurality of power conductors are fabricated on a first selected metal layer, and a second portion of said first plurality of power conductors are fabricated on a second selected metal layer.

4. The programmable block architected integrated circuit according to claim 3 wherein a first portion of said second plurality of power conductors are fabricated on said first metal layer, and a second portion of said second plurality of a power conductors are fabricated on said second metal layer.

5. A programmable block architected heterogeneous integrated circuit, comprising:
a fixed power grid structure having a first plurality of power conductors each one of said first plurality of power conductors being separated by a first predetermined distance with respect to adjacent ones of said first plurality of power conductors, and a second plurality of power conductors each one of said second plurality of power conductors being separated by second predetermined distance with respect to adjacent ones of said second plurality of power conductors, each one of said first plurality of power conductors being perpendicular to each one of said second plurality of power conductors;
at least one firm function block being designed by utilizing basic cells of the programmable block architected heterogeneous integrated circuit to form standard library elements, said at least one firm function block having full floating capability with respect to the fixed power grid structure; and at least one hard function block having a power termination structure to allow said at least one hard function block to be adapted to said fixed power grid structure thereby allowing said at least one hard function block to have full floating capability with respect to the fixed power grid structure.

6. The programmable block architected heterogeneous integrated circuit according to claim 5 wherein a first portion of said first plurality of power conductors are fabricated on a first selected metal layer, and a second portion of said first plurality of power conductors are fabricated on a second selected metal layer.

7. The programmable block architected heterogeneous integrated circuit according to claim 6 wherein a first portion of said second plurality of power conductors are fabricated on said first metal layer, and a second portion of said second plurality of a power conductors are fabricated on said second metal layer.

8. The programmable block architected heterogeneous integrated circuit according to claim 5 further including:

at least one standard cell logic block including a plurality of basic cells, said at least one standard cell logic block being designed according to said fixed power grid structure so as to have full floating capability with respect to said fixed power grid structure, said plurality of basic cells being coupled to implement predetermined functions.

9. The programmable block architected heterogeneous integrated circuit according to claim 5 further including:

at least one gate array programmable logic block including a plurality of logic circuits, said at least one gate array programmable logic block being designed so as to have full floating capability with respect to said fixed power grid structure, said plurality of logic circuits being coupled to implement predetermined functions.

10. The programmable block architected heterogeneous integrated circuit according to claim 5 further including:

at least one logic block including a plurality of logic circuits being designed from cells which are substantially different than said basic cells of the programmable block architected heterogeneous integrated circuit, said at least one logic block having a power termination structure to allow said at least one logic block to be adapted to said fixed power grid structure thereby allowing said at least one logic block to have full floating capability with respect to said fixed power grid structure.

11. The programmable block architected heterogeneous integrated circuit according to claim 5 wherein said at least one firm function block is created manually or automatically by utilizing said standard library elements and wherein said at least one firm function block is placed manually or automatically within the programmable block architected heterogeneous integrated circuit.

12. The programmable block architected heterogeneous integrated circuit according to claim 5 wherein said at least one hard function block is created manually or automatically and wherein said at least one hard function block is placed manually or automatically within the programmable block architected heterogeneous integrated circuit.

13. The programmable block architected heterogeneous integrated circuit according to claim 5 wherein said power termination structure includes:

a first annular metal structure encompassing said at least one hard function block, said first annular metal structure being coupled to receive a first voltage;

a second annular metal structure encompassing said at least one hard function block, said second annular metal structure being coupled to receive a second voltage;

at least one metal conductor being coupled between a first power supply terminal of said at least one hard function block and said first annular metal ring; and at least one metal conductor being coupled between a second power supply terminal of said at least one hard function block and said second annular metal ring.

* * * * *